(12) United States Patent
Yamada et al.

(10) Patent No.: US 7,909,908 B2
(45) Date of Patent: *Mar. 22, 2011

(54) METHOD OF IMPROVING THE WEATHERABILITY OF COPPER POWDER

(75) Inventors: Tomoya Yamada, Okayama (JP); Koji Hirata, Honjo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 202 days.

This patent is subject to a terminal disclaimer.

(21) Appl. No.: 12/285,968

(22) Filed: Oct. 17, 2008

(65) Prior Publication Data

US 2009/0050857 A1    Feb. 26, 2009

Related U.S. Application Data

(63) Continuation of application No. 11/355,888, filed on Feb. 17, 2006, now abandoned.

(30) Foreign Application Priority Data

Feb. 18, 2005    (JP) ................................. 2005-041712

(51) Int. Cl.
*B22F 9/20*    (2006.01)
*B22F 8/00*    (2006.01)

(52) U.S. Cl. ...................................................... 75/373

(58) Field of Classification Search ..................... 75/369, 75/373

See application file for complete search history.

(56) References Cited

U.S. PATENT DOCUMENTS

| | | | |
|---|---|---|---|
| 2,286,237 A | 6/1942 | Shaw et al. |
| 2,294,895 A | 9/1942 | Drapeau, Jr. et al. |
| 3,212,883 A | 10/1965 | McFarland et al. |
| 4,859,417 A | 8/1989 | Innocenti |
| 4,894,184 A | 1/1990 | Fukuoka et al. |
| 5,470,373 A | 11/1995 | Edelstein et al. |
| 6,679,937 B1 | 1/2004 | Kodas et al. |

FOREIGN PATENT DOCUMENTS

| | | |
|---|---|---|
| JP | 1-290706 | 11/1989 |
| JP | 2200746 | 8/1990 |
| JP | 5-057324 | 8/1993 |
| JP | 10-330801 | 12/1998 |

*Primary Examiner* — Roy King
*Assistant Examiner* — Ngoclan T Mai
(74) *Attorney, Agent, or Firm* — Clark & Brody

(57) ABSTRACT

A copper powder that is excellent in weatherability and adapted for use in conductive paste is provided that contains 10-20,000 ppm, preferably 100-2,000 ppm, of Sn. The copper powder is particularly preferably one having an average particle diameter DM of 0.1-2 μm and, further, one wherein the particle diameter of at least 80% of all particles is in the range of 0.5 DM-1.5 DM. This copper powder can be produced, for example, by precipitating Cu metal by reduction of Cu ions in the presence of Sn ions.

4 Claims, 2 Drawing Sheets

METHOD OF IMPROVING THE WEATHERABILITY OF COPPER POWDER

This is a continuation application of Ser. No. 11/355,888, filed on Feb. 17, 2006 now abandoned.

BACKGROUND OF THE INVENTION

1. Field of the Invention

This invention relates to a fine copper powder suitable for use as filler in a conductive paste or the like, particularly to such a copper powder having improved weatherability.

2. Background Art

Conductive pastes are widely used for forming electronic circuits and the external electrodes of ceramic capacitors. Typical conductive fillers used in conductive pastes include copper, nickel, silver and the like. Among these, copper is used extensively nowadays because it is inexpensive, low in resistance and excellent in anti-migration property. A conductive filler comprising a mixture of copper powders of various particle diameters is usually used in a conductive paste for the external electrodes of a ceramic capacitor. However, in order to form a dense film for improving electrode reliability, the copper powder prior to mixing needs to be one of high fineness, e.g., of a particle diameter of not greater than 0.5 μm, and of uniform particle size.

Methods available for copper powder production include, for example, the atomization process, mechanical crushing process, electrolytic deposition process, vapor deposition process and wet reduction process. The wet reduction process is the main one used today because it is superior in the point of enabling efficient production of a copper powder that is composed of fine spherical particles having a narrow particle size distribution and, as such, is suitable for use in a conductive paste. For example, the prior art includes processes for obtaining fine copper powder by using hydrazine to reduce copper oxide, as taught by JP 10-330801A, JP 1-290706A and JP 5-57324B.

SUMMARY OF THE INVENTION

The prior art processes enable production of a fine copper powder having relatively uniform particle size. However, the use of electronic equipment utilizing conductive paste in an increasingly broad range of applications in recent years has led to a need for conductive pastes with aging deterioration resistance property capable of ensuring long-term, stable operation of electronic equipment in various environments. A need has also arisen for the copper powder used as a conductive filler to exhibit stability of surface condition and resistance against aging deterioration during the storage period between production and use in a paste. Basic properties strongly desired of a copper powder for use in conductive paste have therefore come to include resistance to oxidation during storage at room temperature, i.e., excellent weatherability.

Nevertheless, the response to the need for improvement of the weatherability of copper powder for use in conductive paste has so far been inadequate. The present invention is aimed at developing and providing a fine copper powder for conductive pastes that is uniform in particle size and high in weatherability.

Through various studies, the inventors learned that a copper powder containing a suitable amount of tin (Sn) exhibits a marked improvement in weatherability. Specifically, the present invention provides a copper powder containing 10-20,000 ppm, preferably 100-2,000 ppm, of Sn. The copper powder is particularly preferably one having an average particle diameter $D_M$ of 0.1-2 μm and, further, one wherein the particle diameter of at least 80% of all particles is in the range of $0.5\,D_M$-$1.5\,D_M$. This copper powder can be produced, for example, by precipitating Cu metal in an aqueous medium by reduction of Cu ions in the presence of Sn ions. It is preferably produced by reducing cuprous oxide of an Sn content of 10-1,000 ppm in an aqueous medium. Note that as termed in this specification, "particle diameter" means the particle diameter measured along the major axis of the particle.

This invention enables improvement of the weatherability of a copper powder by means of incorporating Sn therein. The copper powder can be efficiently produced by a method capable of utilizing electrolytic cuprous oxide as the Cu starting material developed by the inventors, using Sn contained in the electrolytic cuprous oxide as impurity, without need for any special process for weatherability improvement. By optimizing the Sn content, a copper powder having the properties fundamentally required by a copper powder for conductive paste can be obtained. The present invention therefore contributes to improvement of electronic equipment reliability by providing a copper powder for conductive paste imparted with weatherability and high in cost performance.

DESCRIPTION OF THE PREFERRED EMBODIMENT

Figure 1:
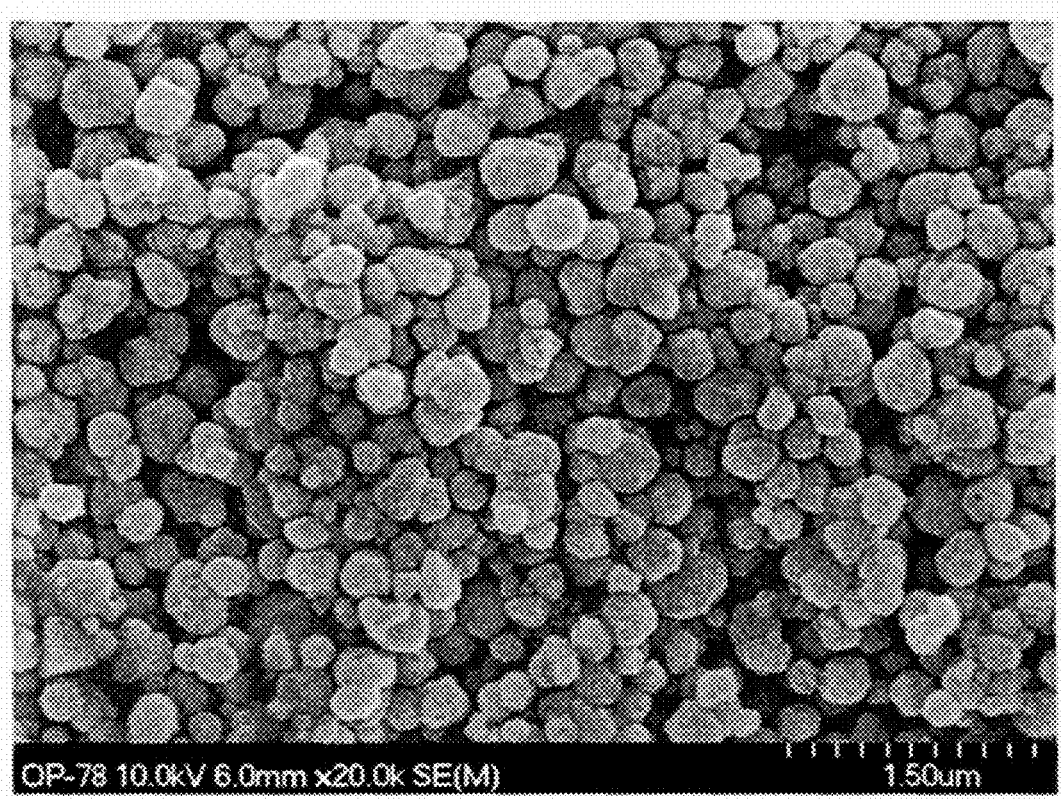
FIG. 1 is a scanning electron micrograph showing an example of the appearance of the copper powder of the present invention.

The inventors learned through various studies that a copper powder containing Sn can be obtained by reducing Cu ions in the presence of Sn ion in an aqueous medium. It was further discovered that a copper powder containing an optimal amount of Sn exhibits a property of strongly resisting bonding with oxygen such as during storage in air at room temperature, i.e., exhibits excellent weatherability by which change in the surface state owing to progressive oxidation does not readily occur. A copper powder excellent in such weatherability can be produced using the copper powder production process developed by the inventors explained in the following.

Use of electrolytic cuprous oxide as the Cu starting material is advantageous from the viewpoint of easy availability and low cost. However, when cuprous oxide is reduced by a conventional production process, the particle size distribution of the obtained copper powder depends strongly on the particle size distribution of the cuprous oxide. That is, the reaction rate is affected by change in the surface area of the cuprous oxide with variation in its particle diameter so that the particle diameter of the obtained copper particles also varies. This is particularly true when using coarse cuprous oxide of a particle diameter of several μm or greater, because the small specific surface area of the cuprous oxide makes the reaction rate slow for the scale of the Cu source mass, so that the particle diameter of the copper particles also tends to become large. Electrolytic cuprous oxides generally available on the market are of irregular particle shape and vary in particle size distribution. Copper powder of constant particle diameter is therefore very difficult to produce with good reproducibility by a conventional reduction method using electrolytic cuprous oxide as starting material.

Based on the results of in-depth research, the inventors developed a method comprising the steps of preparing a mixed liquor obtained by mixing electrolytic cuprous oxide as the principal starting material and a more readily soluble water-soluble copper salt in an aqueous medium, causing a reducing agent to act on the mixed liquor to induce preferential early precipitation of Cu derived from the copper salt, and using this Cu as nuclei for precipitating Cu derived from the electrolytic cuprous oxide. This method makes it possible to produce fine copper powder of controlled particle size unaffected by the particle size distribution of the electrolytic cuprous oxide.

Thus in this method, before reduction of the cuprous oxide by the reducing agent, the Cu ions liquated out of the water-soluble copper salt that reacts more readily than the cuprous oxide rapidly react with the reducing agent to form a nuclei for particle growth. Next, Cu ions liquated out of the particle surfaces of the cuprous oxide that is the principal starting material are reduced and precipitate onto the nuclei. At this time, the reduction reaction of the cuprous oxide precedes quite gradually so that spherical copper particles of uniform particle size are formed. Therefore, the particle diameter of the obtained copper particles is determined by the number of the nuclei for growth and does not depend on the particle size distribution of the cuprous oxide. In other words, the average particle diameter of the obtained copper powder is determined by the mass of the starting material cuprous oxide and the number of the nuclei and the range of the particle size distribution thereof is narrow. Minute observation showed that the precipitate constituting the nuclei for growth consisted of aggregated copper particles of a particle diameter of 20-50 nm.

It is important here to add a protective colloid to the liquor in advance, before allowing the preferential reduction reaction of the water-soluble copper salt to occur. The size of the aggregates can be controlled by varying the amounts of copper salt and protective colloid added. Specifically, a large number of small sized aggregates are produced when the amounts of copper salt and protective colloid are large, so that the particle diameter of the finally obtained copper particles becomes small. To the contrary, when the amounts of copper salt and protective colloid added are small, a small number of large sized aggregates are produced, so that the particle diameter of the final copper particles becomes large. This principle can be used to control the particle diameter of the copper particles, thereby enabling production of a fine copper powder of uniform particle diameter even when using a cheap electrolytic cuprous oxide of irregular particle shape and size as the starting material.

The procedure followed can be either to mix the cuprous oxide, water-soluble copper salt and protective colloid by stirring in an aqueous liquor and add the reducing agent to the mixed liquor or to mix only the water-soluble copper salt and protective colloid together, add the reducing agent to the aqueous liquor obtained to produce the nuclei in advance, and then add and reduce the cuprous oxide that is the principal starting material for Cu particles.

Electrolytic cuprous oxide generally available on the market contains Sn as an impurity. When the aforesaid reduction and precipitation onto the nuclei occurs, Sn liquates out of the starting material electrolytic cuprous oxide together with Cu. This means that Cu ions are reduced in the presence of Sn ions to precipitate as copper metal. It is reasonable to conclude that at the time of Cu metal precipitation the Sn component of the liquor is taken into the interior and onto the surface of the copper particles. The mechanism by which the presence of Sn in the copper particles improves the weatherability of the copper powder is not clear on number of points but it is thought that the Sn forms a distinctive oxide coating on the copper particle surfaces and this coating exerts an effect of inhibiting oxidation of the copper.

Experimentation showed that the effect of improving the weatherability of the copper powder produced by the Sn content is pronounced at an Sn content exceeding about 10 ppm. A marked weatherability improving effect emerges in the Sn content range of 10-100 ppm and becomes extremely high up to at least 2,000 ppm. Moreover, a weatherability improving effect can be enjoyed up to around 20,000 ppm (2 mass %). However, caution is necessary when the Sn content exceeds 20,000 ppm because the resulting decline in the purity of the copper powder is liable to have an adverse effect on the electrical and other properties of the copper powder. The Sn content of the copper powder is affected by the amount of Sn contained in the electrolytic cuprous oxide that is the principal starting material. When the amount of Sn therein is insufficient, it suffices to add a stannic salt. This makes it possible to control the Sn content of the copper powder to an appropriate level.

The cuprous oxide used as the principal starting material is preferably an electrolytic cuprous oxide containing Sn at about 10-1,000 ppm. Use of electrolytic cuprous oxide of an average particle diameter of around 3-10 mµ is particularly preferable from the viewpoint of production cost.

Although the copper salt used as the secondary starting material is required to be water soluble, it can be any of various types. Among such copper salts, monovalent copper salts are preferable because they make the precipitation of nuclei more uniform. Typical examples of these preferable monovalent copper salts include cuprous acetate, cuprous nitride and cuprous chloride. The amount added is preferably about 0.1-20 mole % per 100 mole % of the principal starting material cuprous oxide. When the amount added falls below 0.1 mole %, the effect of impurities in the starting material becomes large to lower production stability. On the other hand, addition of more than 20 mole % is uneconomical because the particle diameter of the copper powder does not change substantially no matter how much copper salt is added in excess of this level.

The protective colloid used can be selected from among such common water-soluble polymers as gum arabic, polyvinyl alcohol, polyethylene glycol, polyvinylpyrrolidone, gelatin and the like. The amount added is preferably about 0.1-1.0 parts by mass per 100 parts by mass of the cuprous oxide. This enables the average particle diameter $D_M$ of the copper particles to be controlled to within the range of 0.1-2 µm or, further, the range of 0.2-1 µm.

Usable reducing agents include hydrazine, hydrazine hydrate, hydrazine compound, formaldehyde, sodium borohydride and the like. Hydrazine and hydrazine hydrate are preferable in the points of reducing power and handling ease. The amount added must be enough to completely reduce the starting materials but is preferably about 50-300 mole % relative to the total amount of Cu. Addition in an amount below this range causes the reduction reaction to proceed too slowly, and addition in an amount above this range causes the reaction to become so vigorous as to make particle diameter control difficult and is also uneconomical. Addition at the rate of 80-150 mole % relative to the total amount of Cu is particularly preferable.

During the reduction reaction, particularly at the particle growth stage, a complexing agent is preferably added in order to stably generate and supply Cu ions. Tartaric acid, acetic acid, citric acid and ammonia and their salts, for example, can be used as the complexing agent and added to the reaction liquor as appropriate. The Sn content of the copper powder can be controlled by adding a stannic compound such as stannic oxide, stannic chloride or the like.

The temperature during reduction is preferably maintained at around 30-80° C. The reduction reaction proceeds too slowly at below 30° C. and at above 80° C. it becomes too vigorous, which promotes generation of secondary nuclei and makes control of particle diameter difficult. A temperature in the range of 40-60° C. is still more preferable.

It is generally considered that a copper powder for conductive paste should consist of fine (small diameter) particles and have a narrow particle size distribution. The average particle diameter $D_M$ is preferably 0.1-2 μm, more preferably 0.2-1 μm. On top of meeting the $D_M$ requirement, it is preferable for the particle diameter of at least 80% of all particles of the copper powder to fall in the range of 0.5 $D_M$-1.5 $D_M$, more preferably for the particle diameter of at least 80% of all particles to fall in the range of 0.7 $D_M$-1.3 $D_M$. The particle size distribution can be so regulated by using the production method explained in the foregoing.

EXAMPLES

Example 1

Electrolytic cuprous oxide of an average particle diameter of 3 μm was prepared. The prepared electrolytic cuprous oxide had a broad particle size distribution, i.e., 50% or more of all particles fell outside the range of 3 μm±1 μm. The Sn content of the electrolytic cuprous oxide was 0.01 mass %. This electrolytic cuprous oxide, 135 g, was dispersed in 3.750 g of pure water. The dispersion was added with 7.5 g of cuprous chloride as water-soluble copper salt and 15 g of polyvinyl alcohol as protective colloid and then heated to 40° C. under stirring. To the heated mixture were added 100 g of 80% hydrazine hydrate as reducing agent and 22.5 g of acetic acid as complexing agent. The resulting liquor was heated to 60° C. over one hour and then held at 60° C. for another hour to allow the reduction reaction to proceed. The liquor after reaction was subjected to solid-liquid separation and the recovered solids were washed with water and dried to obtain a copper powder. The copper powder was observed under a scanning electron microscope (SEM) and the diameters of the particles within the field of vision were measured. It was found that the average particle diameter $D_M$ was 0.3 μm and that the particle diameter of at least 80% of all particles of the copper powder fell in the range of 0.5 $D_M$-1.5 $D_M$. A scanning electron micrograph of the copper powder is shown in FIG. 1.

The copper powder was dissolved in acid and subjected to compositional analysis by ICP spectrometry. The Sn content of the copper powder was found to be 120 ppm.

Example 2

To 3.750 g of pure water were added 7.5 g of cuprous chloride as water-soluble copper salt and 15 g of polyvinyl alcohol as protective colloid. The result was heated to 40° C. under stirring, whereafter 100 g of hydrazine hydrate was added as reducing agent. To the resulting reaction liquor was added 135 g of the same electrolytic cuprous oxide as used in Example 1, 0.43 g of stannic chloride as stannic salt and 22.5 g of acetic acid as complexing agent. The resulting liquor was heated to 60° C. over one hour and then held at 60° C. for another hour to allow the reduction reaction to proceed. The liquor after reaction was subjected to solid-liquid separation and the recovered solids were washed with water and dried to obtain a copper powder. The copper powder was observed under a scanning electron microscope (SEM) and the diameters of the particles within the field of vision were measured. It was found that the average particle diameter $D_M$ was 0.3 μm and that the particle diameter of at least 80% of all particles of the copper powder fell in the range of 0.5 $D_M$-1.5 $D_M$.

The copper powder was subjected to the same compositional analysis as the copper powder of Example 1. The Sn content of the copper powder was found to be 1.900 ppm.

Comparative Example 1

Copper sulfate, 110 g, was dissolved in 330 g of pure water, the solution was neutralized by adding 90 g of sodium hydroxide, followed by addition of 440 g of 60% glucose solution. Cuprous oxide was precipitated by a reduction reaction progressing at 70° C. Hydrazine hydrate, 120 g, was added to the resulting cuprous oxide slurry and the slurry was heated to 90° C. over 3 hours to allow a reduction reaction to proceed. The liquor after reaction was subjected to solid-liquid separation and the recovered solids were washed with water and dried to obtain a copper powder. The copper powder was observed under a scanning electron microscope (SEM) and the diameters of the particles within the field of vision were measured. It was found that the average particle diameter $D_M$ was 0.3 μm.

The copper powder was subjected to the same compositional analysis as the copper powder of Example 1. The Sn content of the copper powder was found to be 3 ppm.

Weatherability Test

The copper powders obtained in Examples 1 and 2 and Comparative Example 1 were individually exposed to atmospheric air in a thermostatic chamber. After a fixed time period, their oxygen amounts were measured by the method of fusion in an inert gas and infrared ray absorption, thereby ascertaining the time-course change in oxygen absorption amount in a 25° C., R.H. 30% atmosphere. The results are shown in FIG. 2.

Figure 2:
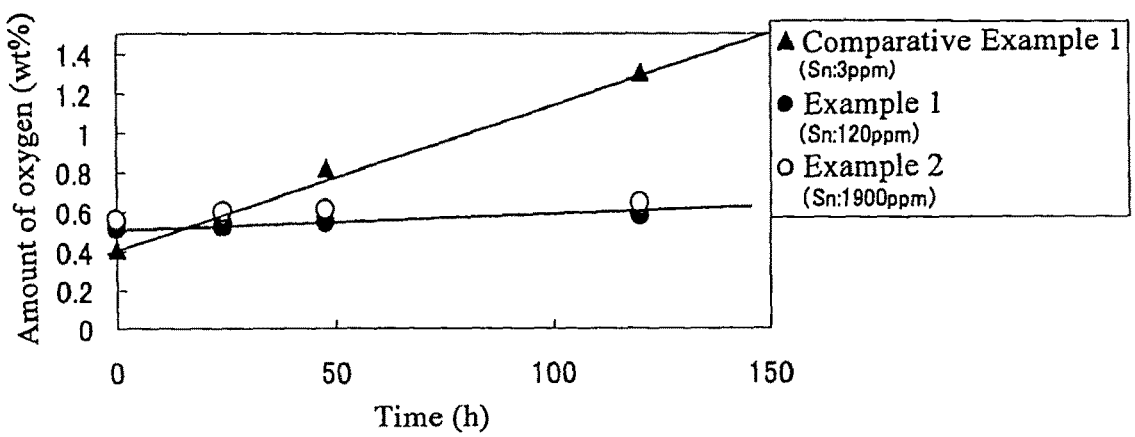
FIG. 2 is a graph showing the results of a weatherability test.

As can be seen in FIG. 2, the amount of oxygen absorbed at room temperature by the Sn-containing copper powders of the Examples was very low, so that they exhibited outstanding weatherability. In contrast, the copper powder of the Comparative Example, which contained almost no Sn, absorbed an increasing amount of oxygen over the course of time and was thus inferior in weatherability.

What is claimed is:

1. A method of producing copper powder containing 10-20,000 ppm of Sn comprising mixing cuprous oxide with a reducing agent in a liquor in which a protective colloid is present and to which a water-soluble copper salt has been added, wherein 0.1-20 moles of a monovalent water-soluble copper salt is used as a water-soluble copper salt per 100 moles of cuprous oxide, and the cuprous oxide is one which has been produced by an electrolytic method and contains Sn.

2. The method of claim 1, wherein the copper powder has an average particle diameter DM of 0.1-2 μm and the particle diameter of at least 50% of all particles is in the range of 0.5 DM-1.5 DM.

3. The method of claim 1, wherein the cuprous oxide contains 10-1,000 ppm of Sn.

4. The method of claim 1, wherein the water-soluble copper salt is a monovalent copper salt and the cuprous oxide containing Sn is one which has been produced by an electrolytic method and has an average particle diameter of 3-10 μm.

* * * * *